US007652605B2

(12) United States Patent
Doi
(10) Patent No.: US 7,652,605 B2
(45) Date of Patent: Jan. 26, 2010

(54) SEMICONDUCTOR DEVICE AND AUDIO PROCESSOR CHIP

(75) Inventor: Koji Doi, Kawasaki (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/935,419

(22) Filed: Nov. 6, 2007

(65) Prior Publication Data

US 2008/0106449 A1 May 8, 2008

(30) Foreign Application Priority Data

Nov. 8, 2006 (JP) ............................ 2006-302765

(51) Int. Cl.
*H03M 1/66* (2006.01)

(52) U.S. Cl. ...................................... 341/144; 341/146

(58) Field of Classification Search ................. 341/144, 341/126, 141, 152, 146, 153
See application file for complete search history.

(56) References Cited

U.S. PATENT DOCUMENTS 4,996,531 A * 2/1991 Kotter et al. ................ 341/157
5,243,346 A * 9/1993 Inami ......................... 341/144
6,304,199 B1 * 10/2001 Fang et al. .................. 341/118
6,989,779 B2 * 1/2006 Sasaki et al. ................ 341/144
7,035,596 B2 4/2006 Sato
7,333,149 B2 * 2/2008 Choi .......................... 348/441
2001/0024169 A1 * 9/2001 Saito .......................... 341/141

FOREIGN PATENT DOCUMENTS

JP 2001-345731 A 12/2001
KR 1996-0015190 5/1996

OTHER PUBLICATIONS

Korean Patent Office issued a Korean Office Action dated Sep. 30, 2009, Application No. 520020416681.

* cited by examiner

*Primary Examiner*—Rexford N Barnie
*Assistant Examiner*—Joseph Lauture
(74) *Attorney, Agent, or Firm*—Young & Thompson

(57) ABSTRACT

An audio processor chip includes a DSP for decoding audio data, a first DAC for performing a D/A conversion to the digital data obtained from the DSP, a PLL circuit for generating a clock signal for the first DAC to supply it to the first DAC and a clock output external terminal for outputting the clock signal obtained from the PLL circuit to a second DAC of an AFE. The first DAC 142 outputs an analog signal obtained from the D/A conversion to an analog mixer and the analog mixer performs a mixing process to the analog signal to output.

4 Claims, 4 Drawing Sheets

PRIOR ART

SEMICONDUCTOR DEVICE AND AUDIO PROCESSOR CHIP

BACKGROUND OF THE INVENTION

1. Field of the Invention

The present invention relates to a semiconductor device and an audio processor chip, and particularly to a semiconductor device and an audio processor chip used for a mobile phone.

2. Description of Related Art

With advances in multi-functionalization and higher performance of mobile phones, mobile phones equipped with data communication function and audio playback function as audio equipment in addition to the original call function with voice have been developed.

As for the audio playback process in a mobile phone, for example audio data downloaded via the network and audio data recorded on recording media such as a removable memory is decoded by a processor of the mobile phone. The decoded data is converted into an analog signal by a D/A converter and is played back by a loudspeaker through a mixing process.

Such mobile phone has been spreading to take the place of dedicated audio playback device and higher performance is required for audio playback.

On the other hand, as described in Japanese Unexamined Patent Application Publication No. 2001-345731, miniaturization and reduction of power consumption in mobile phones are also required due to the characteristics of the mobile phone to be carried along.

Since there is control of power consumption during audio playback for a long time and audio codec that cannot be processed by a processor of a mobile phone, an audio processor only for audio playback is used. In order to distinguish from this audio processor, the processor of the mobile phone stated above is hereinafter referred to as a main processor.

By providing the audio processor, it is possible to playback the audio codec that cannot be processed by the main processor and also to control the power consumption as the main processor can be in a standby state during audio playback for a long time and thereby achieving higher performance.

As for audio playback, a mobile phone of a related art and a mobile phone having an audio processor are compared here.

FIG. 3 shows the pattern diagram of the processing portion concerning audio in the mobile phone of a related art. Usually, in a mobile phone, processes such as application and communication are performed by a chip provided in the platform. As shown in FIG. 3, a DBB 10, an AFE 20 and a clock generation circuit 30 are provided in a platform 1 indicated by DBB PF in FIG. 3. Note that DBB, DBB PF and AFE respectively mean Digital Baseband, Digital Baseband Platform and Analog Front End.

The DBB 10 is a main processing chip having a main processor and a communication processing unit and as for voice processing, decodes audio data and outputs it to the AFE 20.

The AFE 20 is a voice processing chip and includes a DAC (D/A converter) 22 for converting digital data from the DBB 10 into an analog signal and an analog mixer 24 for performing a mixing process to the analog signal obtained from the DAC 22 and outputting to a playback device such as a loudspeaker.

The clock generation circuit 30 generates a clock signal for the DAC 22 of the AFE 20 and supplies it to the DAC 22. In addition, the DAC 22 operates as a clock master circuit of the DBB 10 and the clock signal is to be a master clock (LRCLK and BCLK in the drawings) used when the DBB 10 decodes audio data.

Note that the DBB 10, the AFE 20 and the clock generation circuit 30 are connected to a system bus 40 and the DBB 10 also performs motion control of the AFE 20 and the clock generation circuit 30 via the system bus 40.

When adding an audio processor to the configuration shown in FIG. 3, the pattern shown in FIG. 4 can be considered. As shown in FIG. 4, in addition to each component provided in the platform 1, an audio processor 50 having a DSP (Digital Signal Processor) 52 for decoding audio data, a DAC 54 for converting the data decoded by the DSP 52 into an analog signal and a clock generation circuit 56 for generating a clock signal for the DAC 54 is provided. Note that the analog signal obtained by the DAC 54 is output to the analog mixer 24 of the AFE 20, a mixing process is performed by the analog mixer 24 and then output to a loudspeaker etc.

Moreover, the audio processor 50 is also connected to the system bus 40 and is controlled by the DBB 10 via the system bus 40.

According to the configuration shown in FIG. 4, audio processing can be performed by different processing units depending on the case of usual telephone call and short-time audio playback (hereinafter referred to as a first case) and the case of long-time audio playback and audio codec that cannot be processed by the DBB 10 (hereinafter referred to as a second case).

For example, in the first case, data decoded by the DBB 10 is output to the DAC 22 of the AFE 20. After that, the DAC 22 performs a D/A conversion, obtains an analog signal, outputs it to the analog mixer 24 and a mixing process is performed by the analog mixer 24.

On the other hand, in the second case, the DBB 10 transmits a control signal to the audio processor 50 via the system bus, for example, to operate. The audio processor 50 starts operation in response to the control signal. Specifically, the DSP 52 decodes audio data and outputs the decoded data to the DAC 54. The DAC 54 performs a D/A conversion to the digital data from the DSP 52, obtains an analog signal and outputs this analog signal to the analog mixer 24 of the AFE 20. The analog mixer 24 performs a mixing process to the analog signal and outputs it to a loudspeaker. The clock generation circuit 56 generates a clock signal for the DAC 54 and supplies it to the DAC 54. Note that also in the audio processor 50, the DAC 54 operates as a clock master circuit of the DSP 52, generates a clock signal to be used by the DSP 52 at the time of decoding from the clock signal used by the DAC 54 and supplies it to the DSP 52.

As the power consumption while the audio processor 50 is operating is less than power consumption while the DBB 10 is operating, in the second case, the DBB 10 controls to let the audio processor 50 starts operation and can be in the standby state later on with the configuration shown in FIG. 4. Thus it is possible to save the power consumption. Furthermore, audio playback with higher performance can be offered by the audio processor 50.

As mentioned above, along with the reduction of power consumption in mobile phones, the miniaturization of mobile phones is an important subject in developing mobile phones and can be said to be one of the parameters that influence the competitiveness of mobiles phones. Therefore, it is required to spare no effort to reduce circuit size of mobiles phones and eventually each functional component used in mobile phones. The inventor of the present invention proposes a technique which can reduce a circuit size also for mobile phones provided with the audio processor only for audio playback in order to realize advanced audio playback function.

SUMMARY

In one embodiment, a semiconductor device includes a first D/A converter circuit, a clock generation circuit to generate a clock signal for the first D/A converter circuit and supply it to the first D/A converter circuit, a clock output terminal to output the clock signal generated by the clock generation circuit, a second D/A converter circuit, and a clock input terminal to supply the clock signal output from the clock output terminal to the second D/A converter circuit.

In another embodiment, an audio processor chip includes a D/A converter circuit, a clock generation circuit to supply a clock signal for the D/A converter circuit to the D/A converter circuit and a clock output terminal to output the clock signal generated by the clock generation circuit to outside.

In still another embodiment, a semiconductor device includes a first D/A converter circuit couples to a common node, a second D/A converter circuit couples to the common node, and a clock generation circuit couples to the common node, to generate a clock signal for the first D/A converter circuit and supply it to the first D/A converter circuit and a clock signal for the second D/A converter circuit and supply it to the second D/A converter circuit.

Note that a method and a system representing the above semiconductor device and the audio processor chip are also effective as an aspect of the present invention.

The technique of the present invention is able to reduce the circuit size of a mobile phone having an audio processor only for audio playback.

BRIEF DESCRIPTION OF THE DRAWINGS

The above and other objects and advantages and features of the present invention will be more apparent from description of certain preferred embodiments taken in conjunction with the accompanying, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereafter, an embodiment of the invention is described with reference to the drawings.

Figure 1:
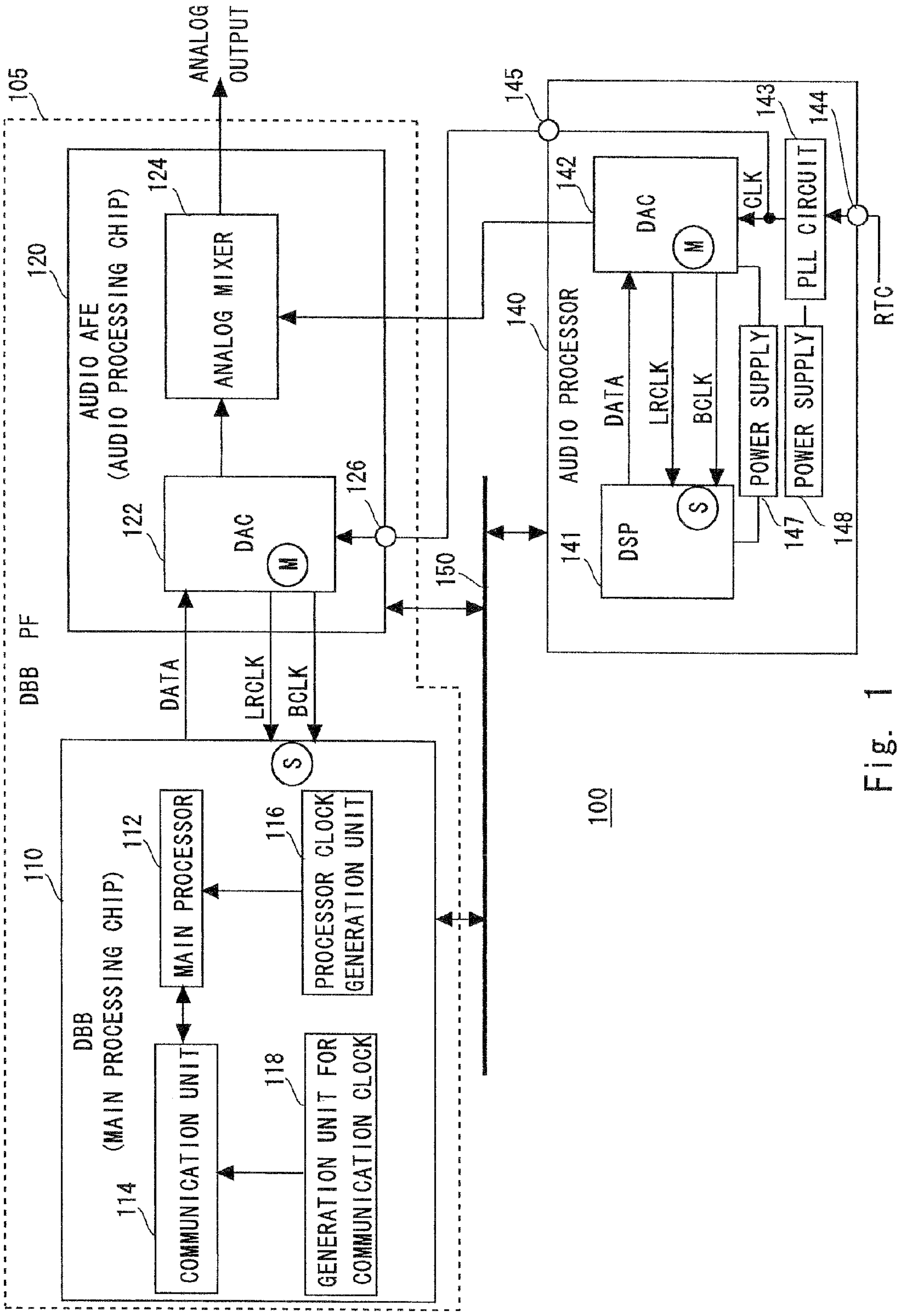
FIG. 1 shows a semiconductor device according to an embodiment of the present invention.

FIG. 1 shows a semiconductor device 100 according to an embodiment of the present invention. The semiconductor device 100 is used for a mobile phone and includes a platform 105 and an audio processor 140.

A DBB 110 and an AFE 120 are provided in the platform 105. The DBB 110 is a main processing chip concerning application and communication process of a mobile phone and includes a main processor 112, a communication unit 114, a processor clock generation unit 116 for generating a clock frequency of the main processor 112 and a generation unit for communication clock 118 for the communication unit 114.

The AFE 120 is an audio processing chip and includes a DAC 122 for converting decoded digital data from the DBB 110 into an analog signal and an analog mixer 124 for performing a mixing process to the analog signal obtained from the DAC 122 and output it to a loudspeaker etc. The analog mixer 124 performs a mixing process to an analog signal also when the analog signal is input from the DAC 142 of the audio processor 140, which is described later As for a clock, the DAC 122 operates as a clock master circuit of the DBB 110 and generates a clock signal (LRCLK and BCLK) used when the DBB 110 decodes audio data according to a clock signal used by the DAC 122 and supplies it to the DBB 110 to be a slave.

The clock signal used by the DAC 122 is input from outside by a clock input external terminal 126 included in the DAC 122. The details are described later.

The audio processor 140 is a chip only for audio playback and includes a DSP 141 for decoding audio data, a DAC 142 for performing a D/A conversion to the data decoded by the DSP 141 to obtain an analog signal and a PLL (Phased Locked Loop) circuit 143 for generating a clock signal CLK for the DAC 142 to supply. A power supply 147 is a power supply for driving the DSP 141 and the DAC 142. A power supply 148 is a power supply for driving the PLL circuit 143.

The PLL circuit 143 multiplies a reference clock and generates a clock signal CLK for the DAC 142. This reference clock is input by a RTC input terminal 144. In this embodiment, a real time clock signal (RTC) used for the time display of a mobile phone as a reference clock for example and 32 KHz RTC is multiplied to a 12.288 MHz clock signal CLK.

The audio processor 140 further includes a clock output external terminal 145 for outputting the clock signal CLK generated by the PLL circuit 143. The clock output external terminal 145 is connected to the clock input external terminal 126 of the AFE 120 mentioned above. The clock input external terminal 126 supplies the clock signal CLK from the clock output external terminal 145 to the DAC 122.

As described above, the semiconductor device 100 of this embodiment includes the audio processor 140 which is a first semiconductor chip, the AFE 120 which is a second semiconductor chip and the DBB 110 which is a third semiconductor chip. These 3 chips are connected to a system bus 150 and the DBB 110 controls the AFE 120 and the audio processor 140 via the system bus 150.

Figure 2:
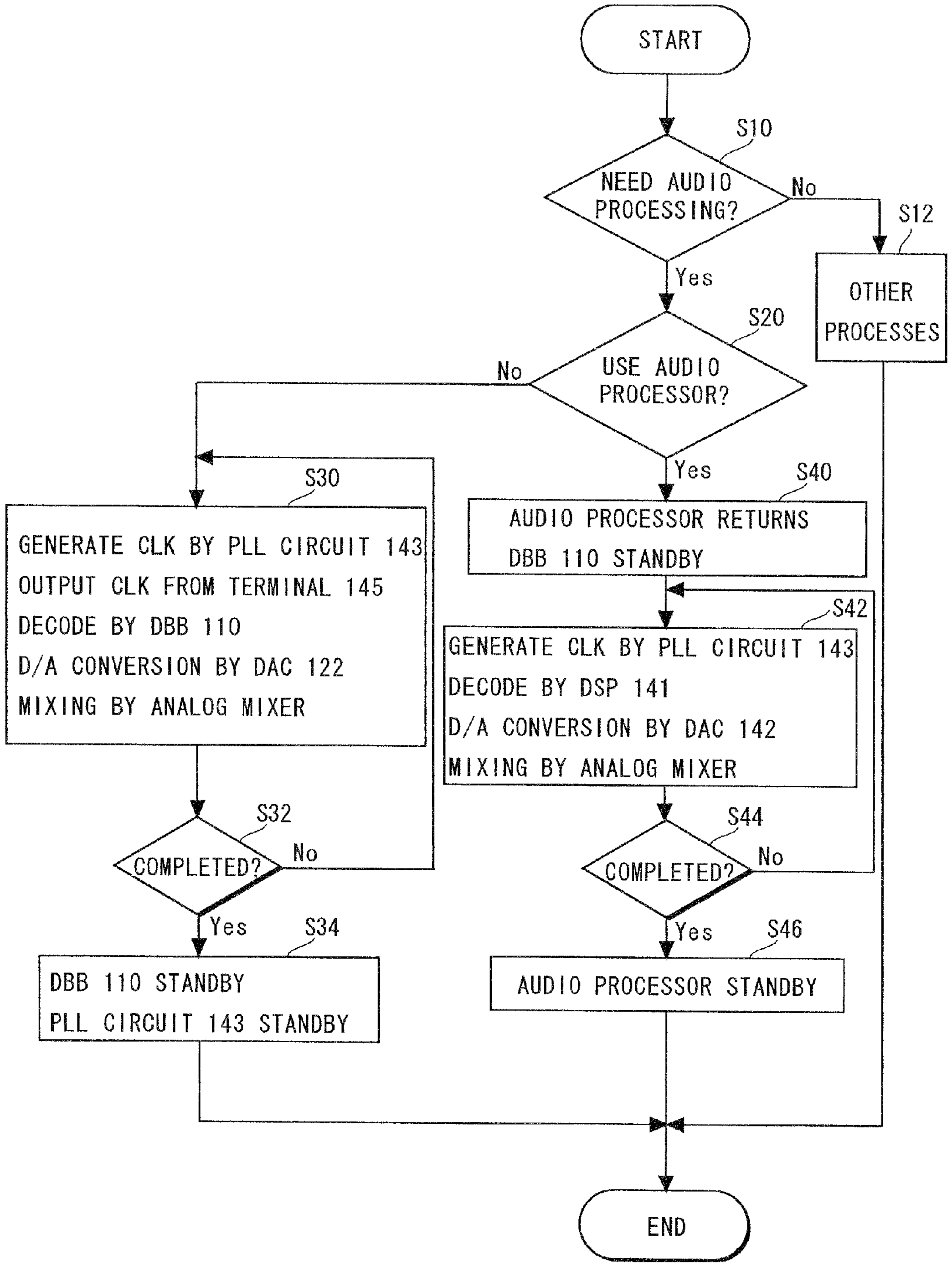
FIG. 2 is a flowchart showing the operation of the semiconductor device shown in FIG. 1.
Figure 3:
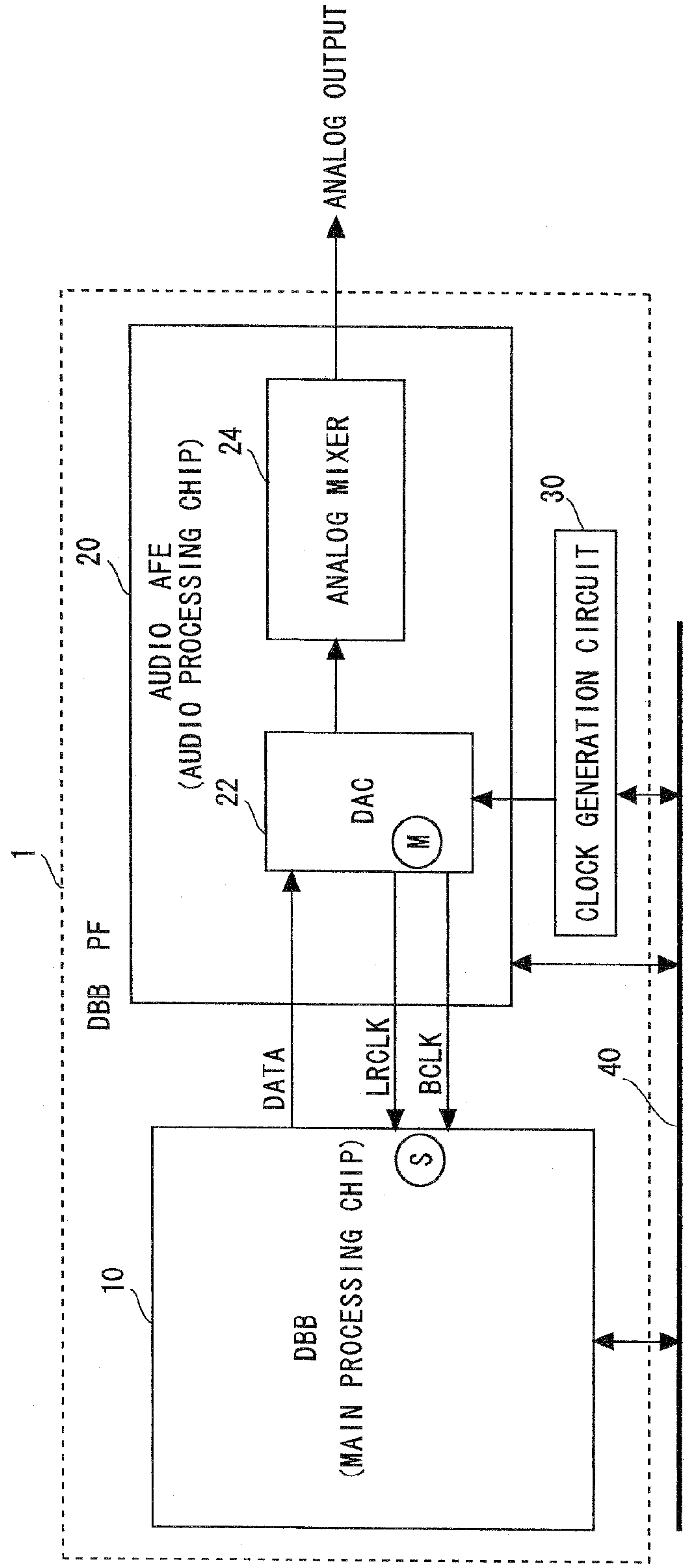
FIG. 3 is a pattern diagram of a semiconductor device in a mobile phone of a related art without an audio processor.

FIG. 2 is a flowchart showing the operation of the semiconductor device 100. Here, for the clarity of explanation, only those relating the audio processing are explained and detailed explanation and illustration are omitted for the other processes such as communication.

The semiconductor device 100 is usually in the standby state and all the chips are standing by. For example, as for the audio processor 140, power is not supplied from the power supply 147 to the DSP 141 and the DAC 142 and power is not supplied from the power supply 148 to the PLL circuit 143. In this state, at the time of an incoming call or a request to start processing by a press of an instruction button in a mobile phone, firstly the DBB 110 returns from the standby state.

To start processing, the DBB 110, specifically the main processor 112, checks whether an audio processing is required for this process (S10). If an audio processing is not required, the DBB 110 lets other processes such as a communication process be performed by the units responsible for the corresponding processes (S10:No, S12).

In the step S10, if an audio processing is required, the main processor 112 further checks whether the audio processing is performed by the audio processor 140 or not (S10:Yes, S20). The cases when an audio processing is to be performed by the audio processor 140 is previously configured by a program of the main processor 112, such as the case when the data amount of audio data to be played back is large or playback time is long or the case of audio codec that can only be processed by the audio processor 140.

If the audio processing is not to be performed by the audio processor 140 in the step S20 (S20:No), the main processor 112 outputs a control signal for operating the PLL circuit 143 of the audio processor 140 and a control signal for operating the AFE 120 via the system bus 150 and then the process of the step S30 is performed.

In the step S30, in the audio processor 140, in response to the control signal from the main processor 112, the power supply 148 starts supplying power to the PLL circuit 143 and the PLL circuit 143 returns from the standby state to operate. The PLL circuit 143 multiplies a RTC input via the RTC input terminal 144 and generates a clock signal CLK. The clock signal CLK generated by the PLL circuit 143 is supplied by the clock output external terminal 145 and the clock input external terminal 126 to the DAC 122 of the AFE 120 which returned from the standby state similarly in response to the control signal from the DBB 110. Then LRCLK and BCLK that use the clock signal CLK as a master clock are supplied to the DBB 110 by the DAC 122. The main processor 112 decodes audio data with reference to LRCLK and BCLK and outputs the decoded digital data to the DAC 122. The DAC 122 converts the digital data from the main processor 112 into an analog signal and outputs it to the analog mixer 124. The analog mixer 124 performs a mixing process to this analog signal to output.

The process of the step S30 is repeated until the process of all audio data is completed (S32:No). When the process of all audio data is completed (S32:Yes), the DBB 110 returns to the standby state. In the audio processor 140, the power supply 148 stops supplying power to the PLL circuit 143 and the PLL circuit 143 returns to the standby state (S34).

Note that during the process in the step S40, the DSP 141 and the DAC 142 of the audio processor 140 continue to be in the standby state.

On the other hand, when an audio processing is performed by the audio processor 140 in the step S20 (S20:Yes), the main processor 112 outputs a control signal which operates the DSP 141, the DAC 142 and the PLL circuit 143 of the audio processor 140, that is, the entire audio processor 140, via the system bus 150 and returns to the standby state (S40).

The audio processor 140 receives the control signal from the main processor 112 and performs the process shown in the step S40. More specifically, power supply from the power supply 148 to the PLL circuit 143 is started and the PLL circuit 143 multiplies a RTC input via the RTC input terminal 144, generates a clock signal CLK and supplies it to the DAC 142. Moreover, the DSP 141 and the DAC 142 return from the standby state. The DAC 142 generates LRCLK and BCLK which use the clock signal CLK as a master clock and supplies them to the DSP 141. The DSP 141 decodes audio data with reference to LRCLK and BCLK from the DAC 142 and outputs the decoded digital data to the PLL circuit 143. The DAC 143 converts the digital data from the DSP 141 into an analog signal and outputs it to the analog mixer 124 of the AFE 120. The analog mixer 124 performs a mixing process to this analog signal to output.

The process of the step S40 is repeated until the process of all audio data is completed (S44:No). When the process of all audio data is completed (S44:Yes), the audio processor 140 returns to the standby state (S46).

Note that during the process in the step S40, the DSP 141 and the DAC 142 of the audio processor 140 continue to be in the standby state.

Figure 4:
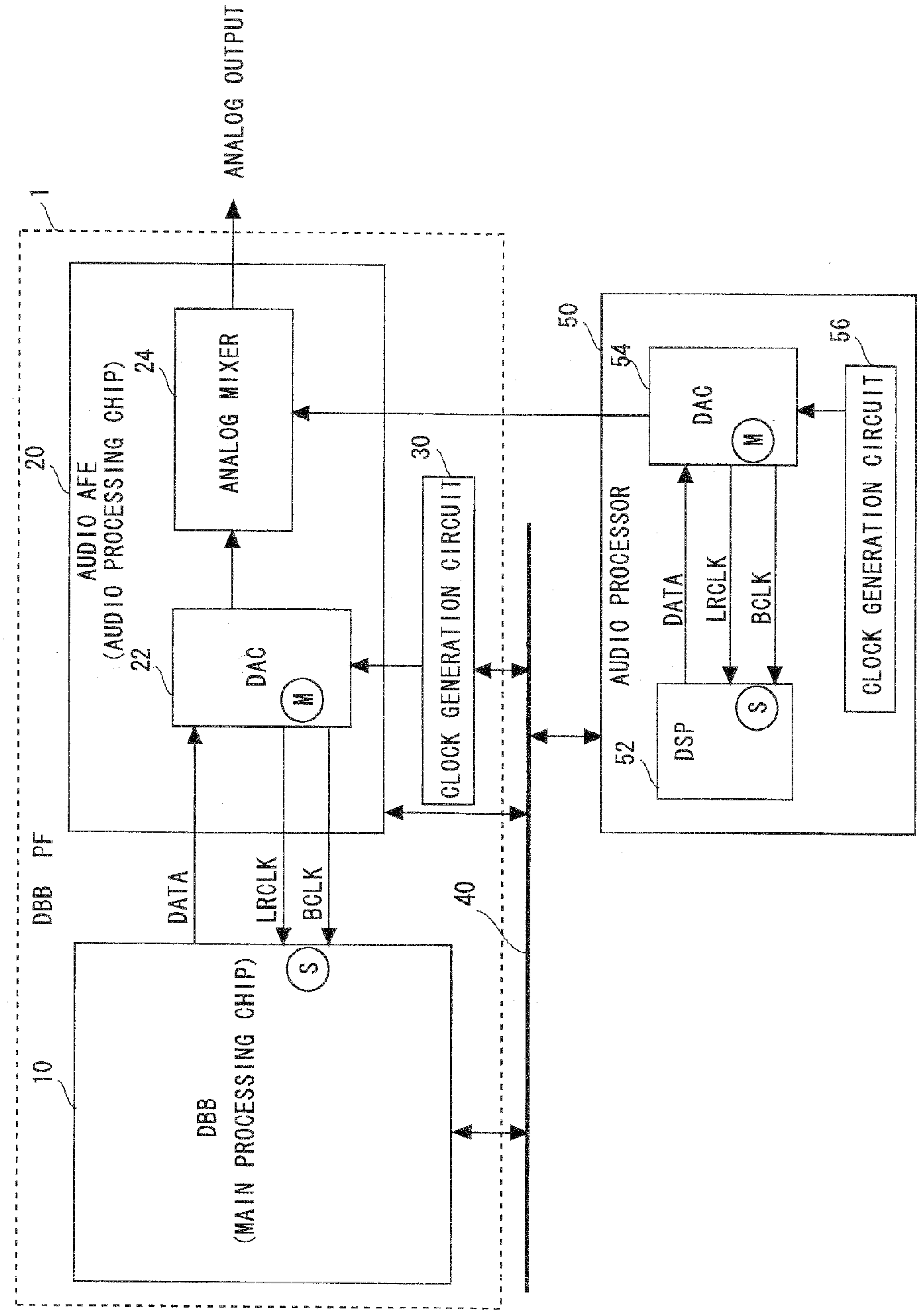
Fig. 4 Prior Art
FIG. 4 is a pattern diagram of the semiconductor device in a mobile phone of a related art having an audio processor.

As described above, the semiconductor device 100 of this embodiment is not required to separately provide a clock signal for the DAC 122 by providing the clock output external terminal 145 which outputs the clock signal CLK generated by the PLL circuit 143 of the audio processor 140 to the DAC 122 of the AFE 120. As can be seen from the comparison with the configuration shown in FIG. 4, as the clock generation circuit in the semiconductor device of FIG. 4 can be omitted, the circuit size can be reduced even when providing an audio processor only for audio playback.

Furthermore, in the semiconductor device 100 of this embodiment, as the PLL circuit 143 functioning as a clock generation circuit multiplies a RTC, which is always used in a mobile phone, to generate a clock signal CLK for the DAC 142 and the DAC 122, it is possible to supply the clock signal CLK without providing an oscillator or the like for generating a reference clock.

Moreover, in the audio processor 140 of the semiconductor device 100, when performing an audio processing by the DBB 110 and the AFE 120, by separately providing the power supply 147 for driving the DSP 141 and the DAC 142 and the power supply 148 for driving the PLL circuit 143, only the power supply 148 which supplies power to the PLL circuit 144 is made to be turned on. Then, when the DSP 141 and the DAC 142 do not need return, the power supply 147 which supplies power to the DSP 141 and the DAC 142 can continue to stop supplying power to the DSP 141 and the DAC 142 and the power consumption can be controlled to be low.

The present invention is explained according to the embodiment as above. The embodiment is illustrative only and various modification, addition and subtraction can be made without departing from the scope of the present invention. Many such variations and modifications may be considered within the range of the present invention by those skilled in the art.

For example, for easy understanding of the purpose of the present invention, an input mode of audio data to be processed is omitted in the explanation of the semiconductor device 100. The technique of the present invention can be incorporated to any input modes of audio data. For example, when processing audio data downloaded via a network by the audio processor 140, the DBB 110 performs a communication process for download or the like, stores the downloaded data in a memory etc. and obtains the audio data from the memory to process. Moreover, when processing audio data recorded on a removable recording medium such as a flash memory (registered trademark) by an audio processor, the audio processor should just directly obtain the audio data from the recording medium.

It is apparent that the present invention is not limited to the above embodiments, but may be modified and changed without departing from the scope and spirit of the invention.

What is claimed is:

1. A semiconductor device comprising:

a first D/A converter circuit formed on a first semiconductor chip couples to a common node;

a second D/A converter circuit formed on a second semiconductor chip couples to the common node;

a clock generation circuit formed on the first semiconductor chip, couples to the common node, to generate a clock signal for the first D/A converter circuit and supply it to the first D/A converter circuit and a clock signal for the second D/A converter circuit and supply it to the second D/A converter circuit;

a main processor formed on a third semiconductor chip that connects with the first D/A converter circuit, wherein the first D/A converter circuit receives a first data from the main processor; and a digital signaling processor formed on the first semiconductor chip that couples between the main processor and the second D/A converter circuit, wherein the second D/A converter circuit receives a third data generated by the digital signaling processor based on a second data supplied from the main processor.

2. The semiconductor device according to claim 1, wherein the main processor supplies the first data to the first D/A converter circuit in the first mode, and supplies the second data to the second D/A converter circuit through the digital signaling processor in the second mode.

3. The semiconductor device according to claim 2, further comprising;

a control circuit renders the second D/A converter circuit inactive in the first mode, and renders the second D/A converter circuit active in the second mode.

4. A semiconductor device comprising:

a first D/A converter circuit couples to a common node;

a second D/A converter circuit couples to the common node;

a clock generation circuit, couples to the common node, to generate a clock signal for the first D/A converter circuit and supply it to the first D/A converter circuit and a clock signal for the second D/A converter circuit and supply it to the second D/A converter circuit;

a main processor connects with the first D/A converter circuit, wherein the first D/A converter circuit receives a first data from the main processor; and a digital signaling processor couples between the main processor and the second D/A converter circuit, wherein the second D/A converter circuit receives a third data generated by the digital signaling processor based on a second data supplied from the main processor.

* * * * *